Oct. 18, 1966 H. BENDA 3,280,392

ELECTRONIC SEMICONDUCTOR DEVICE OF THE FOUR-LAYER JUNCTION TYPE

Filed May 8, 1962

3,280,392
Patented Oct. 18, 1966

3,280,392

ELECTRONIC SEMICONDUCTOR DEVICE OF THE FOUR-LAYER JUNCTION TYPE

Hansjochen Benda, Erlangen, Germany, assignor to Siemens-Schuckertwerke Aktiengesellschaft, Erlangen, Germany, a corporation of Germany Filed May 8, 1962, Ser. No. 193,675
Claims priority, application Germany, May 9, 1961, S 73,885
6 Claims. (Cl. 317—235)

My invention relates to electronic semiconductor devices of the four-layer junction type, such as silicon controlled rectifiers.

Such devices have an essentially monocrystalline semiconductor body with four zones of alternately different conductance type. The two outer zones, containing a higher concentration of activator (donor or acceptor) impurities than the two intermediate zones, are provided with respective main electrodes or terminals and one of them constitutes the (electron or hole) emitter of the device. The two intermediate zones of lower activator concentration constitute the base, a base electrode being joined with one of the intermediate zones adjacent to the emitter. It has been proposed to provide the surface of the semiconductor body between the emitter zone and the adjacent base zone with an electrically conducting coating to act as a shunt connection.

Silicon controlled rectifiers and other four-layer junction devices applicable as electronic switches in thyratron fashion sometimes exhibit an unfavorable characteristic with respect to their blocking ability at relatively high operating temperatures. The increase in blocking current results in increased current amplification. As a result the firing of the device takes place at a considerably lower voltage value than when the operating temperature is only little above normal room temperature. It is known that the efficiency of an emitter in such a device can be reduced by providing the emitter-base path of the semiconductor body with a shunt connection. That is, when a resistor is connected parallel to the emitter-base path of a semiconductor switching device, the current amplification at increasing temperatures becomes reduced and the firing of the device takes place at higher operating temperatures only when similarly high voltage values are reached as when operating the four-layer device at normal room temperature. The above-mentioned coating acts in the sense of such a shunt connection.

It is an object of my invention to further improve four-layer semiconductor devices of the above-mentioned type toward better independence of the switching properties and parameters from the operating temperature.

I have discovered, according to my invention, that such improvement is obtained in four-layer semiconductor devices wherein the base zone and the emitter zone are in large-area engagement with each other along a substantially planar surface, if the emitter zone is interrupted at a multiplicity of localities finely distributed over the emitter surface, by integral parts of the base zone that extend through the emitter zone up to the surface of the semiconductor device, a conductive coating being provided on the emitter surface so as to electrically connect the emitter zone with the parts of the base zone emerging at the surface.

My invention is predicated upon the fact that it was found preferable in many cases to reduce the resistance of the shunt connection between emitter and base zone down to the zero value and hence to virtually bridge the pn-junction between emitter zone and base zone by a short circuit. I have further found, particularly with semiconductor devices of the above-described type having relatively large-area junctions between emitter and base, that the effect of such a shunt circuit is particularly intensive when the bridging of the pn-junction occurs not only at a singular location but is given a relatively uniform distribution over the entire edge of the emitter zone.

My invention therefore aims to further augment the just-mentioned effect by subdividing the entire emitter surface so as to say into individual area elements to each of which an immediately adjacent shunt connection or virtual short-circuiting connection is assigned.

The invention will be further described and explained with reference to an embodiment of a silicon controlled rectifier according to the invention illustrated by way of example on the accompanying drawing in which.

The illustrated four-layer semiconductor device can be produced, for example, in the following manner. Used as starting material is a circular semiconductor disc of n-type silicon having a specific resistance of about 50 to 150 ohm-cm., about 18 mm. diameter and about 0.25 mm. thickness. Aluminum is diffused into the surface region of this silicon disc. For this purpose the disc is heated in the presence of aluminum in vacuum at a temperature of about 1200° C. and is kept at this temperature for about one day before being permitted to cool. Three electrodes, more fully described hereinafter, are then joined with the disc. Thereafter the outer region of the disc which has become diffused with aluminum and has thereby assumed p-type conductance, is divided into two portions by etching into the body a circular groove extending down to the core portion that retained its original n-type conductance.

Figure 1:
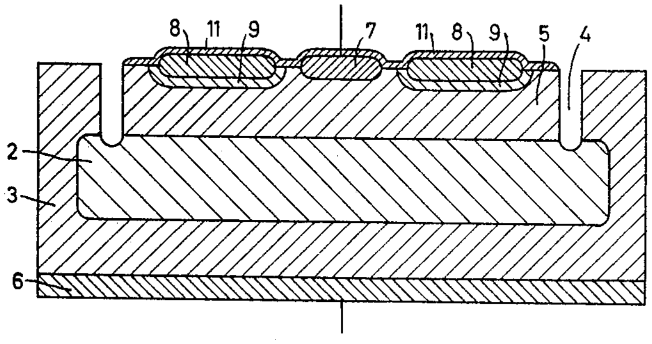
FIG. 1 shows the rectifier in section.
Figure 2:
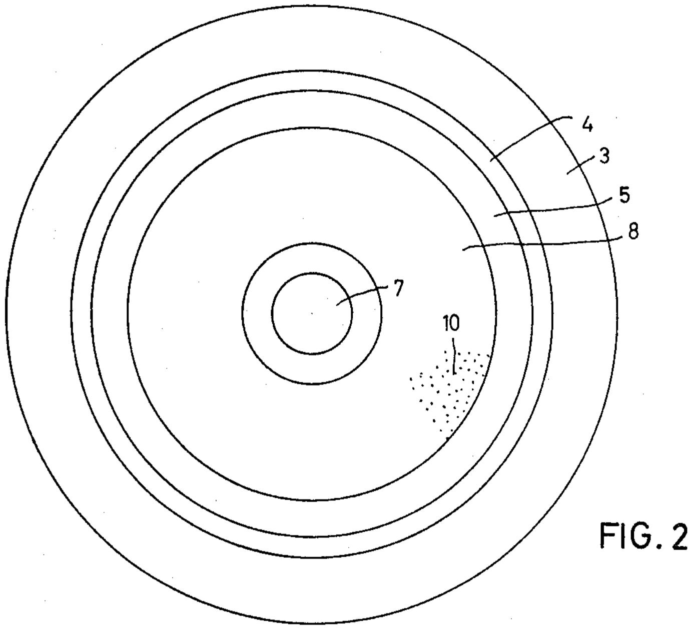
FIG. 2 is a top view of the same rectifier.

The result of this process is shown in FIG. 1. The core of the silicon disc having a thickness of about 0.1 mm. has remained unchanged and constitutes an n-type base zone 2. A portion of the aluminum-doped surface region forms the highly doped p-type outer (collector) zone 3. The other portion of the surface region, separated by the etched groove 4, forms the p-type base zone 5. The highly doped p-zone 3 is contacted by an electrode 6 produced by alloying into the silicon body a boron-containing gold foil, for example with about 0.3% boron, the remainder being gold. The foil has a diameter of about 19 mm. and a thickness of 0.03 mm. The p-type base region 5, constituting the base proper in the finished semiconductor device, is contacted by a circular electrode 7 located in the center of the device opposite to the electrode 6. The electrode 7 can be produced by alloying into the silicon body a foil or disc of about 2 mm. outer diameter consisting of the same gold-boron material as used for producing the electrode 6.

The base electrode 7 is surrounded by a ring-shaped contact electrode 8 which is in large-area junction with a likewise ring-shaped n-type zone 9 that constitutes the emitter of the device. The ring-shaped electrode 8 and the emitter zone 9 can be produced by placing a flat annular disc of a gold-antimony alloy, having an inner diameter of about 3 to 4 mm. and an outer diameter of about 14 mm., concentrically about the base electrode 7 upon the surface of the silicon region 5 and then alloying the annular disc into the silicon body by heating. During the alloying process, a portion of the region 5, namely the zone 9, becomes reversely doped because the donor action of the antimony thus introduced into the silicon is more intensive than the acceptor action of the aluminum previously diffused into the silicon. The remainder of the gold melt, after solidifying, constitutes the contact electrode 8 joined with the emitter zone 9.

All above-described alloying processes are preferably performed in a single operation. For this purpose the semiconductor disc, after being subjected to aluminum diffusion, is assembled with the gold foils and then placed together with these foils into a vacuum furnace where it is heated to a temperature of about 700° C. Suitable, however, is any other alloying temperature above the eutectic temperature of gold and silicon which is at about 370° C. During this operation, the entire assembly may be embedded in a powder that does not melt at the procesing temperature and does not react with the components of the assembly. Suitable as such embedding powder is graphite, for example.

Figure 3:
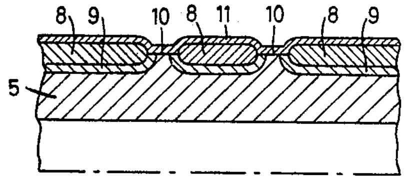
FIG. 3 shows a portion of the emitter-base region taken from FIG. 1 but represented on a large scale, the dimensions, particularly thickness ratios, being distorted in both figures to permit sufficient illustration of the actually very much smaller dimensions.

For the purpose of my invention, the above-described flat ring electrode of gold-antimony alloy is perforated at numerous localities 10 before it is assembled with the silicon disc in the above-described manner and hence before it is alloyed together with the silicon body. At the perforations 10 of the gold foil no alloy is formed during the above-described process. Consequently, at these localities the base zone 5 subsequently migrates through the emitter zone 9 up to the surface of the semiconductor device, as is apparent from FIG. 3. When the semiconductor device is provided with electrodes in the above-described manner and, after the alloying process, has cooled to room temperature, the surface of the device is coated with a conductive varnish or other conductive material which constitutes an electric connection between the parts of the emitter zone 5 that emerge at the localities 10 at the surface of the electrode 8 upon which the conductive coating is deposited.

The coating can be placed upon the entire surface of the emitter zone and thus also upon the emitter contact electrode because the coating is not harmful at those places where it is not required for the purposes proper of the invention. The coating is preferably produced by depositing a colloidal graphite solution or suspension on the surface of the semiconductor body.

Also suitable as a conductive coating is a metal layer which can be vaporized upon the emitter surface. Another way of producing a conductive coating is to subject the emitter surface to oxidizing etching, for example, by means of an etching solution composed to equal parts of fuming nitric acid, distilled hydrofluoric acid and acetic acid, as known for etching purposes in semiconductor techniques.

Since the coating is to act virtually as a short-circuit, it should be given a substantial thickness. For graphite a thickness of 50$\mu$ to 1 mm. has been found well applicable. When using vapor-deposited metal coatings, a thickness of 5 to 50$\mu$, preferably about 10$\mu$ is sufficient.

For producing the contact electrode 8, I have found it preferable to employ a gold-antimony foil of about 30 to 50$\mu$ thickness, for example 35$\mu$. The alloying depth, i.e., the thickness of the emitter zone 9 in this case is approximately 20$\mu$. The perforations in the gold-antimony foil may consist of individual holes of about 100 to 200$\mu$ diameter. I have found that this is amply sufficient for preventing the edges of the hole from becoming alloyed together and to thereby inadvertently close the perforation during the alloying process. On the other hand, the holes should be kept as small as feasible in order to prevent an appreciable reduction in emitter surface. The spacing of the holes 10 from each other may be approximately 1 mm. Experience, particularly with small four-layer devices, has shown that such spacing is small enough for obtaining the desired improved performance.

Figure 4:
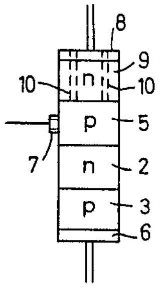
FIG. 4 is an explanatory, schematic diagram relating to the same device.

In principle, it is not essential whether the shunt circuit is thus produced between the p-zone (5 in FIG. 4) and the n-emitter (9 in FIG. 4), or between the n-type base zone 2 and the p-emitter 3. However, it is preferable, as exemplified by the above-described embodiment, to provide the shunt connection between the emitter and the one base zone responsible for the largest of the two current-amplification factors.

While, as mentioned, the conductor shunt connection in the illustrated embodiment is effective between the p-base 5 and the n-emitter 9, the following method can be employed, for example, for producing a four-layer semiconductor device with reversed conditions. A correspondingly perforated aluminum foil is placed upon a surface area of a semiconductor body, for example n-type silicon. The assembly is then heated to about 800° C. This produces a p-type zone interrupted by parts of the n-type substratum zone, the interruptions extending up to the surface of the semiconductor body in substantially the same manner as described above with reference to p-type interruptions 10 of an n-type emitter 9.

To those skilled in the art it will be obvious upon a study of this disclosure that my invention permits of a variety of modifications with respect to the particular shape and arrangement of the individual components of the four-layer semiconductor device as well as with respect to the particular methods employed for doping purposes and for joining electrodes with the semiconductor body. Hence, my invention can be given embodiments other than particularly illustrated and described herein, without departing from the essential features of my invention and within the scope of the claims annexed hereto.

I claim:

1. An electronic pnpn-junction semiconductor device comprising an essentially monocrystalline semiconductor body having two outer zones of higher dope concentration than the two inner zones, one of said outer zones constituting the emitter zone and the next adjacent inner zone constituting the base zone of the device, said base zone and said emitter zone being in substantially planar area junction with each other, said base zone having a multiplicity of integral parts thereof extending through said emitter zone to the surface of the device at respective localities distributed over the junction area, a control electrode in said base zone, and an electrically conductive coating on said body contacting said emitter zone and forming a resistance connection between said base zone parts at the emitter surface.

2. A four-zone pnpn semiconductor device comprising a semiconductor body having two outer zones of higher dope concentration than the two inner zones, one of said outer zones constituting the emitter zone and the next adjacent inner zone constituting the base zone of the device, an emitter electrode and a base electrode joined with said emitter zone and said base zone respectively, said base zone and said emitter zone being in substantially planar area junction with each other, said emitter zone having a multiplicity of perforations finely distributed over the area of the emitter zone, and said base zone having a multiplicity of integral parts thereof extending through said perforations of said emitter electrode to the surface of said emitter electrode, a control electrode in said base zone, and an electrically conductive coating on said emitter electrode forming a resistance connection between said base-zone parts.

3. In a pnpn-junction device according to claim 1, said coating consisting of graphite.

4. A four-zone pnpn semiconductor device comprising a semiconductor body having two outer zones of higher dope concentration than the two inner zones, one of said outer zones constituting the emitter zone and the next adjacent inner zone constituting the base zone of the device, an emitter electrode and a base electrode joined with said emitter zone and said base zone respectively, said base zone and said emitter zone being in substantially planar area junction with each other, said emitter electrode having a multiplicity of perforations distributed over the junction area, said emitter zone having interruptions in registry with said respective perforations and said base zone having a multiplicity of integral parts thereof extending through said respective interruptions and perforations to the surface of said emitter, a control electrode in said base zone, and an electrically conductive coating on said emitter electrode forming a resistance connection between said base-zone parts.

5. In an electronic semiconductor device according to claim 4, said perforations having a diameter of about 100 to about 200 microns and being spaced about 1 mm. from each other.

6. A silicon controlled rectifier comprising a silicon disc having a first zone of a given conductance type at one disc side and having an electrode in face-to-face engagement with said side, said disc having in its interior a second zone of the opposite conductance type adjacent to said first zone, said disc having a third zone of said given conductance type next adjacent to said second zone and separated from said first zone, a centrally located base control electrode on the other side of said disc in contact with said third zone, a ring-shaped emitter electrode surrounding said base electrode on said other side, and a fourth zone of said opposite conductance type forming an emitter zone between said emitter electrode and said third zone, said emitter electrode having a multiplicity of finely distributed perforations, said emitter zone being interrupted at a multiplicity of localities registering with said respective perforations, and said third zone having integral parts protruding through said respective interruptions and perforations to the surface of said emitter electrode, and a conductive coating disposed on the surface of said emitter electrode and said third zone and connecting said parts with said third zone.

References Cited by the Examiner

UNITED STATES PATENTS

| | | | |
|---|---|---|---|
| 2,930,950 | 3/1960 | Teszner | 317—235 |
| 2,971,139 | 2/1961 | Noyce | 317—235 |
| 3,078,196 | 2/1963 | Ross | 317—235 |
| 3,097,335 | 6/1963 | Schmidt | 317—235 |
| 3,124,703 | 3/1964 | Sylvan | 217—235 |

JOHN W. HUCKERT, *Primary Examiner.*

JAMES D. KALLAM, *Examiner.*

A. S. KATZ, J. D. CRAIG, *Assistant Examiners.*